United States Patent
Hwu et al.

(10) Patent No.: US 8,525,588 B1
(45) Date of Patent: Sep. 3, 2013

(54) VACUUM ELECTRONIC DEVICE

(75) Inventors: Ruey-Jen Hwu, Salt Lake City, UT (US); Laurence P. Sadwick, Salt Lake City, UT (US); Jishi Ren, Ottowa Ontario (CA)

(73) Assignee: InnoSys, Inc., Salt Lake City, UT (US)

( * ) Notice: Subject to any disclaimer, the term of this patent is extended or adjusted under 35 U.S.C. 154(b) by 0 days.

(21) Appl. No.: 13/549,398

(22) Filed: Jul. 13, 2012

Related U.S. Application Data

(63) Continuation-in-part of application No. 12/263,438, filed on Oct. 31, 2008, now abandoned, and a continuation of application No. 12/775,466, filed on May 6, 2010, now Pat. No. 8,242,696.

(51) Int. Cl.
| | |
|---|---|
| *H03F 3/56* | (2006.01) |
| *H03B 9/08* | (2006.01) |
| *H01J 7/24* | (2006.01) |
| *H05B 31/26* | (2006.01) |
| *H05B 6/64* | (2006.01) |

(52) U.S. Cl.
USPC ............ 330/45; 330/43; 330/56; 330/4.6; 330/4.7; 331/82; 315/3.5; 315/3.6; 315/111.41; 315/111.51; 315/111.81; 219/756

(58) Field of Classification Search
USPC ......... 315/3.5, 3.6, 5, 5.14, 363, 393, 111.31, 315/111.41, 111.51, 111.81; 330/4.6, 4.7, 330/43, 44, 45, 56, 145; 331/79, 81, 82, 331/187; 219/745, 746, 748, 750, 756, 757
See application file for complete search history.

(56) References Cited

U.S. PATENT DOCUMENTS

| | | | | |
|---|---|---|---|---|
| 3,982,152 | A | * | 9/1976 | Smith .......................... 315/3.6 |
| 4,376,908 | A | * | 3/1983 | Chaffee ...................... 315/39.3 |
| 4,951,380 | A | * | 8/1990 | Smith ............................ 29/600 |
| 5,319,322 | A | * | 6/1994 | O'Loughlin .................... 331/81 |
| 6,987,360 | B1 | * | 1/2006 | Caplan et al. ................ 315/3.5 |
| 8,138,838 | B2 | * | 3/2012 | Hogan ........................... 330/308 |
| 8,179,045 | B2 | * | 5/2012 | Goren et al. .................. 315/3.5 |
| 8,242,696 | B1 | * | 8/2012 | Hwu et al. ..................... 315/3.5 |
| 2003/0039446 | A1 | * | 2/2003 | Hutchinson et al. ............ 385/39 |
| 2012/0141127 | A1 | * | 6/2012 | Hogan ............................ 398/45 |

* cited by examiner

*Primary Examiner* — Bernard E Souw
(74) *Attorney, Agent, or Firm* — Hamilton, DeSanctis & Cha

(57) ABSTRACT

Various apparatuses and methods for a vacuum electronic device are disclosed herein. In one embodiment, a vacuum electronic device includes a vacuum housing, an array of slow wave structures inside the vacuum housing sharing a common electron beam tunnel, an electron beam input port at a first end of the common electron beam tunnel, and an electron beam output port at a second end of the common electron beam tunnel.

20 Claims, 16 Drawing Sheets

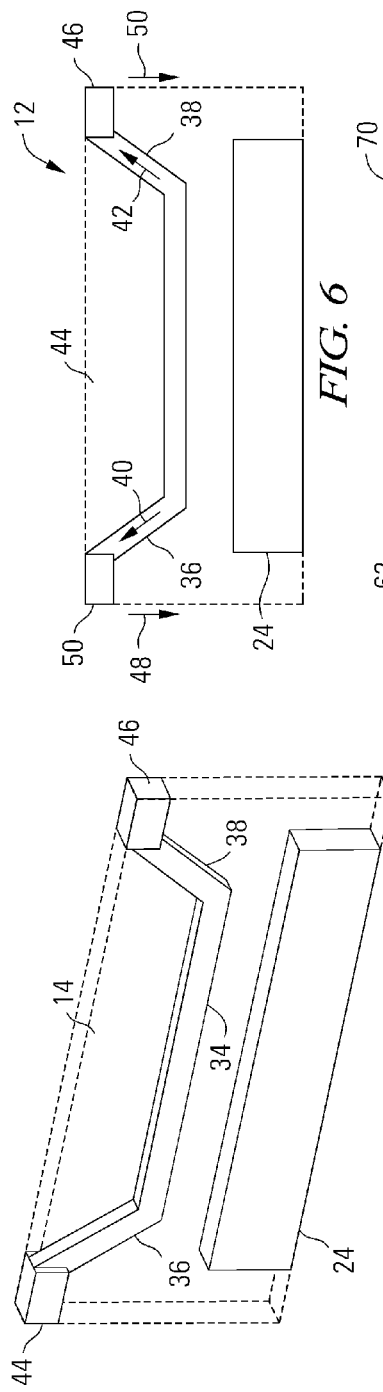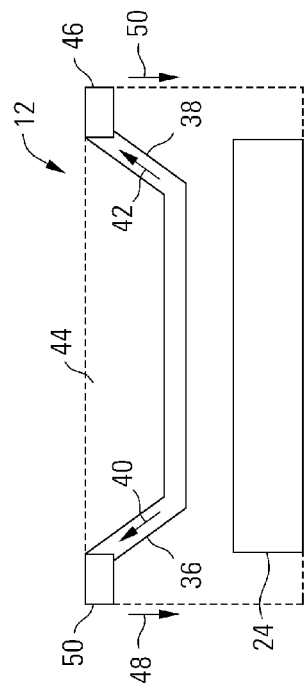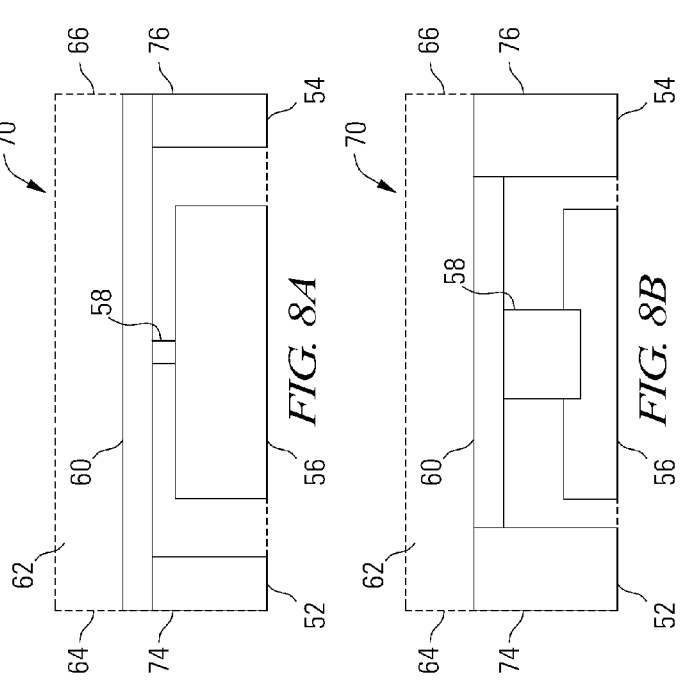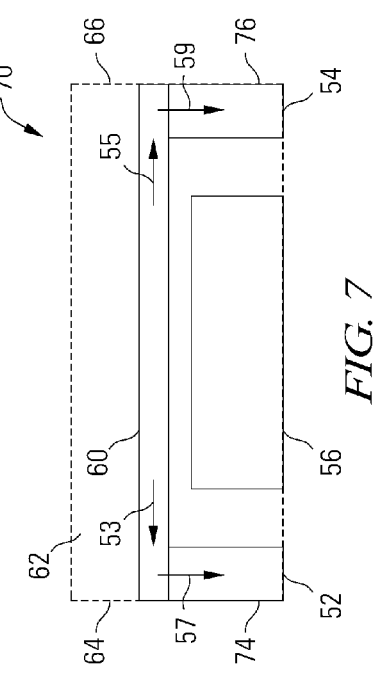

VACUUM ELECTRONIC DEVICE

CROSS REFERENCE TO RELATED APPLICATION

The present application claims priority to U.S. Provisional Patent Application No. 60/984,376 entitled "Sheet Beam Slow Wave Structure", and filed Nov. 1, 2007 by Hwu et al., and to U.S. patent application Ser. No. 12/263,438 entitled "Sheet Beam Slow Wave Structure", and filed Oct. 31, 2008 by Hwu et al, and to U.S. patent application Ser. No. 12/775,466 entitled "Vacuum Electronic Device", and filed May 6, 2010 by Hwu et al. The aforementioned applications are assigned to an entity common hereto, and the entirety of the aforementioned applications are incorporated herein by reference for all purposes.

BACKGROUND

Microwave electronic devices, sometimes referred to as radio frequency (RF) devices or vacuum electronic devices, are used in systems with important functions such as radar and high speed communications systems, etc. A traveling wave tube (TWT) may be used as an amplifier that increases the gain, power or some other characteristic of an RF signal, that is, of electromagnetic waves typically within a range of around 0.3 GHz to above 300 GHz. An RF signal to be amplified is passed through the device, where it interacts with and is amplified by an electron beam. The TWT is a vacuum device through which the electron beam travels, typically focused by a magnetic field to prevent the electron beam from directly touching the structure of the TWT.

The electron beam may be generated at the cathode of an electron gun, which is typically heated, for example to about 1000 degrees Celsius. Electrons are emitted from the heated cathode by thermionic emission and are drawn through the TWT to a collector by a high voltage bias, focused by the magnetic field.

The TWT also contains a slow wave structure (SWS) that provides reactive loading in the TWT to slow the phase velocity of the RF signal. For example, a tunnel ladder is one type of slow wave structure in which a pair of wire ladders form a tunnel for the electron beam, with the ladder rungs supported by ridges outside the tunnel. As the RF signal passes through the TWT cavity around the slow wave structure, the capacitance of the SWS slows the phase velocity of the RF signal to about the velocity of the electron beam. Currents are induced in the ladder by the RF signal, creating electromagnetic fields that cause the electrons in the electron beam to bunch up in waves. The velocity-modulated electron beam creates an electromagnetic field that transfers energy from the beam to the RF signal and amplifies the RF signal.

The power of the TWT is limited by the interaction of the electron beam with the RF signal and by the thermal characteristics of the TWT.

SUMMARY

Various apparatuses and methods for a vacuum electronic device are disclosed herein. In some embodiments, the vacuum electronic device comprises a quasi-sheet beam device accommodating a flattened electron beam. In some embodiments, the vacuum electronic device includes a vacuum housing, a slow wave structure having an electron beam tunnel that is open at a pair of sides, wherein magnetic walls are formed during operation at the pair of sides. The vacuum electronic device also includes an electron beam input port at a first end of the common electron beam tunnel, and an electron beam output port at a second end of the common electron beam tunnel.

In an embodiment of the vacuum electronic device, the slow wave structure comprises an array of slow wave structures, each of the array of slow wave structures being connected to a neighboring one of the array of slow wave structures at one of the pair of sides. The electron beam tunnel of each of the array of slow wave structures are joined to form a common electron beam tunnel.

In an embodiment of the vacuum electronic device, the array of slow wave structures comprises a linear array. In an embodiment of the vacuum electronic device, each of the array of slow wave structures has at least one short structure that does not impinge on the common electron beam tunnel and that is connected to the vacuum housing.

In an embodiment of the vacuum electronic device, the slow wave structures in the array of slow wave structures are joined at the short structures.

An embodiment of the vacuum electronic device also includes at least one RF input port and at least one RF output port.

In an embodiment of the vacuum electronic device, the RF input and output ports comprise end feed ports, wherein the ports enter the vacuum housing on a plane substantially parallel to the array of slow wave structures.

In an embodiment of the vacuum electronic device, the RF input and output ports comprise perpendicular feed ports, wherein the ports enter the vacuum housing on a plane substantially perpendicular to the array of slow wave structures.

An embodiment of the vacuum electronic device also includes a sheet beam electron gun connected to the electron beam input port and a collector connected to the electron beam output port.

An embodiment of the vacuum electronic device also includes an array of electron guns connected to the electron beam input port, with each of the array of electron guns corresponding to one of the array of slow wave structures.

In an embodiment of the vacuum electronic device, the array of electron guns comprises an array of oval beam electron guns.

In an embodiment of the vacuum electronic device, the array of slow wave structures comprises an array of tunnel ladder cells each joined at a short structure.

In an embodiment of the vacuum electronic device, the array of slow wave structures includes a number of parallel rungs above and below the common electron beam tunnel, a number of short structures connected to the rungs and to the vacuum housing, and a number of ridges between the short structures and adjacent the rungs, with the short structures and ridges being substantially perpendicular to the rungs.

An embodiment of the vacuum electronic device also includes a number of dielectric spacers between the ridges and rungs.

Other embodiments provide a method of manufacturing a vacuum electronic device, the method including enclosing an electron beam tunnel with a plurality of flat rungs, leaving the electron beam tunnel open at a first side and a second side, and supporting the rungs with at least one short structure that does not impinge on the electron beam tunnel.

An embodiment of the method also includes forming an array of the slow wave structures such that electron beam tunnels in each slow wave tunnel in the array are contiguous to form a larger shared electron beam tunnel.

In an embodiment of the method, a number of short structures and ridges are formed on an inner surface of a housing in alternating fashion, and a number of rungs are fabricated perpendicular to and connected to the short structures.

In an embodiment of the method, the slow wave structures are connected in a linear array, such that the shared electron beam tunnel comprises a planar electron beam tunnel.

An embodiment of the method includes increasing the number of slow wave structures in the array to increase power in the vacuum electronic device.

Other embodiments provide a vacuum electronic spatial power combining array having a vacuum housing, a slow wave structure array inside the vacuum housing, an array of oval beam electron guns connected to a first end of the vacuum housing, a collector connected to a second end of the vacuum housing, and an ion pump connected to the vacuum housing. The slow wave structure array includes a number of tunnel ladder cells having open magnetic side walls joined in a linear array to create a planar electron beam tunnel. The SWS array includes a number of rungs above and below the electron beam tunnel, the rungs being supported within the vacuum housing by short structures between the rungs and the vacuum housing. The SWS array also includes ridges connected to the vacuum housing between the short structures, and dielectric spacers between the ridges and the rungs.

This summary provides only a general outline of some exemplary embodiments. Many other objects, features, advantages and other embodiments will become more fully apparent from the following detailed description, the appended claims and the accompanying drawings.

BRIEF DESCRIPTION OF THE DRAWINGS

A further understanding of the various exemplary embodiments may be realized by reference to the figures which are described in remaining portions of the specification. In the figures, like reference numerals may be used throughout several drawings to refer to similar components. Furthermore, dashed lines are used to represent a vacuum cavity inside a TWT, while solid lines are used to represent physical structures inside a TWT.

FIG. 5 depicts a perspective view of half of a quasi-sheet beam SWS.

FIG. 6 depicts an end view of half of a quasi-sheet beam SWS.

FIG. 7 depicts an end view of a unit cell of half of a modified quasi-sheet beam SWS.

FIGS. 8A and 8B depict end views of a unit cell of half of a SWS including various embodiments of dielectric spacers.

DESCRIPTION

Figure 1:
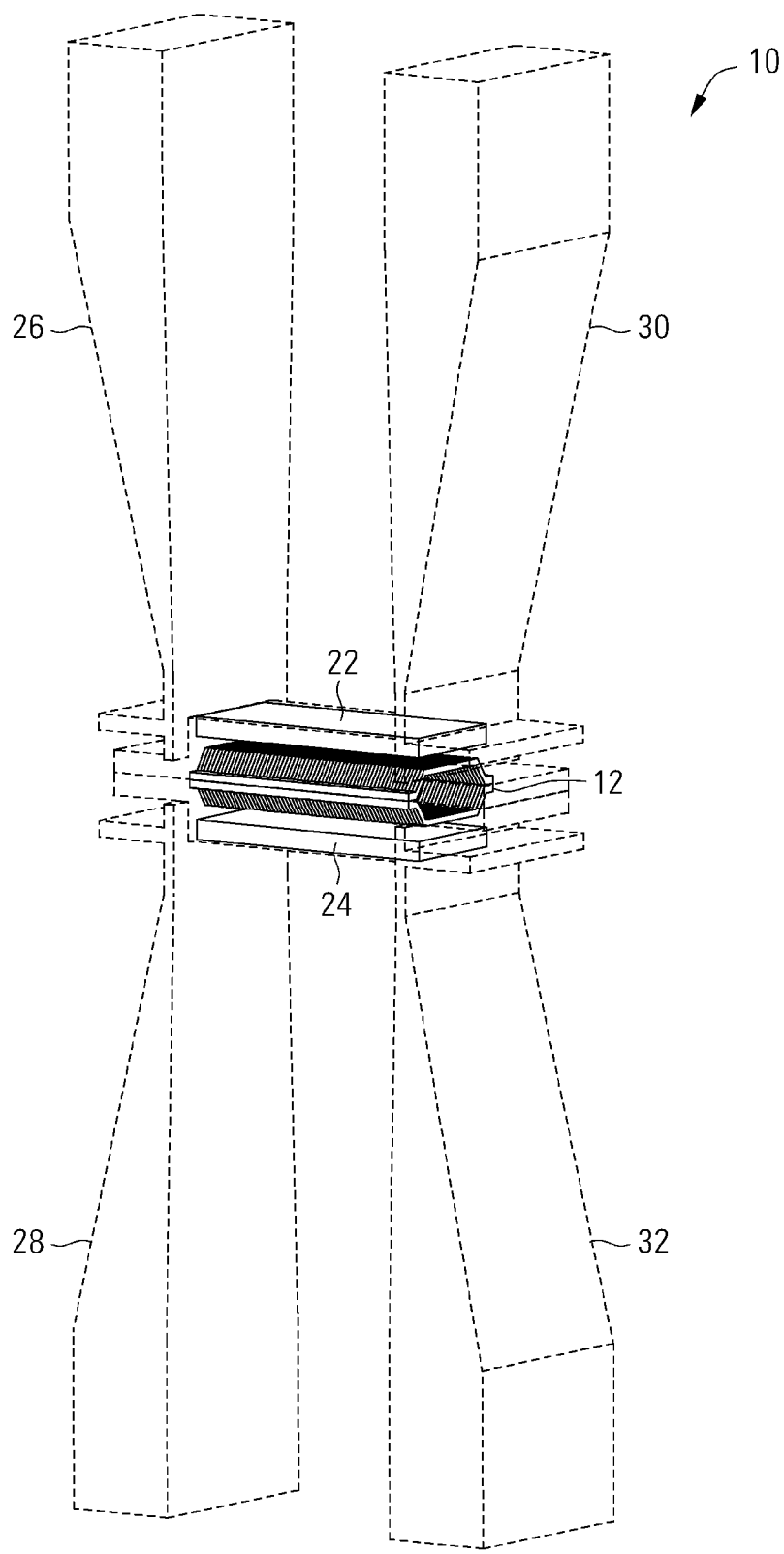
FIG. 1 depicts a perspective view of a TWT with a quasi-sheet beam SWS.
Figure 2:
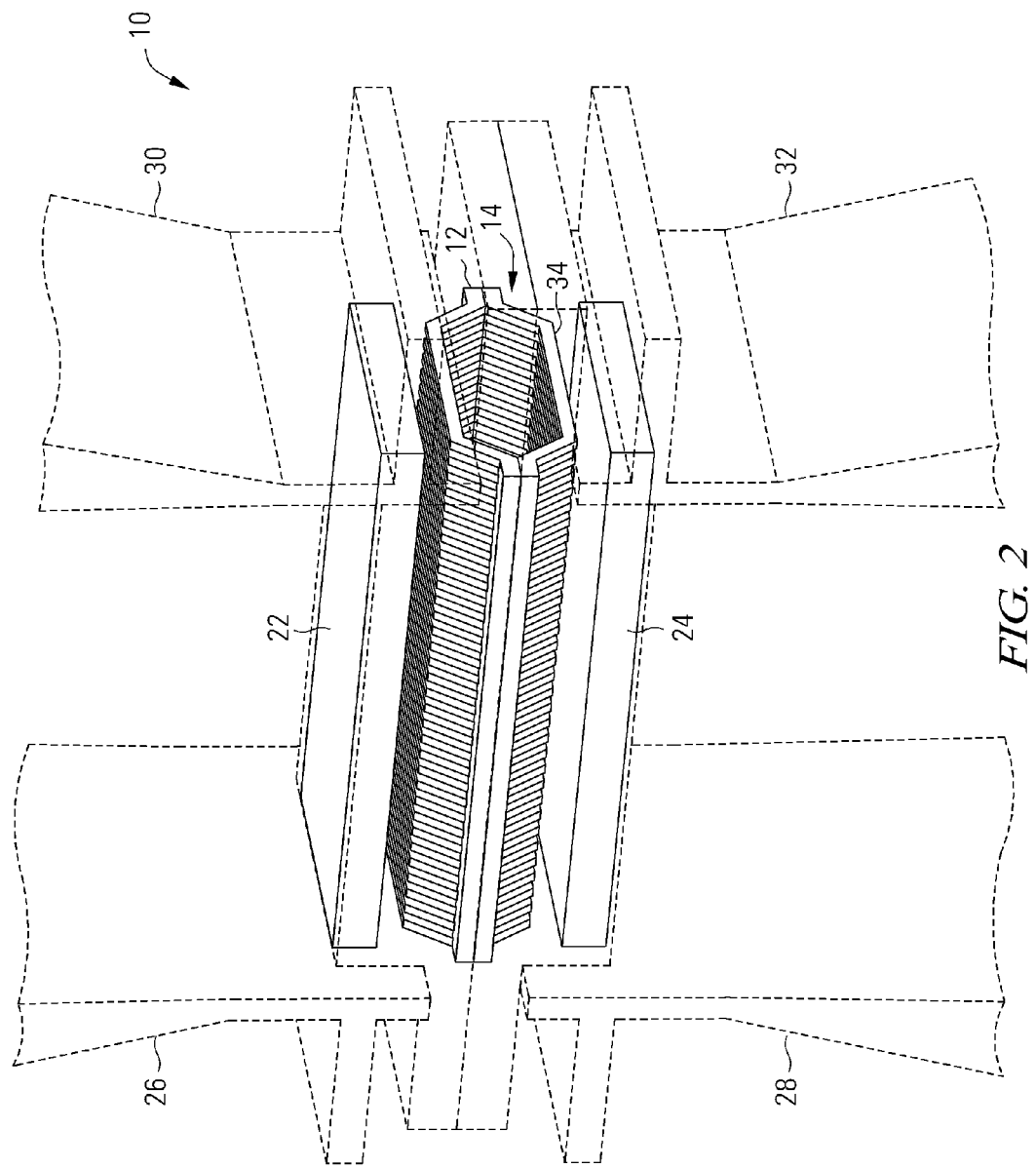
FIG. 2 depicts a closeup perspective view of the TWT with quasi-sheet beam SWS of FIG. 1.
Figure 3:
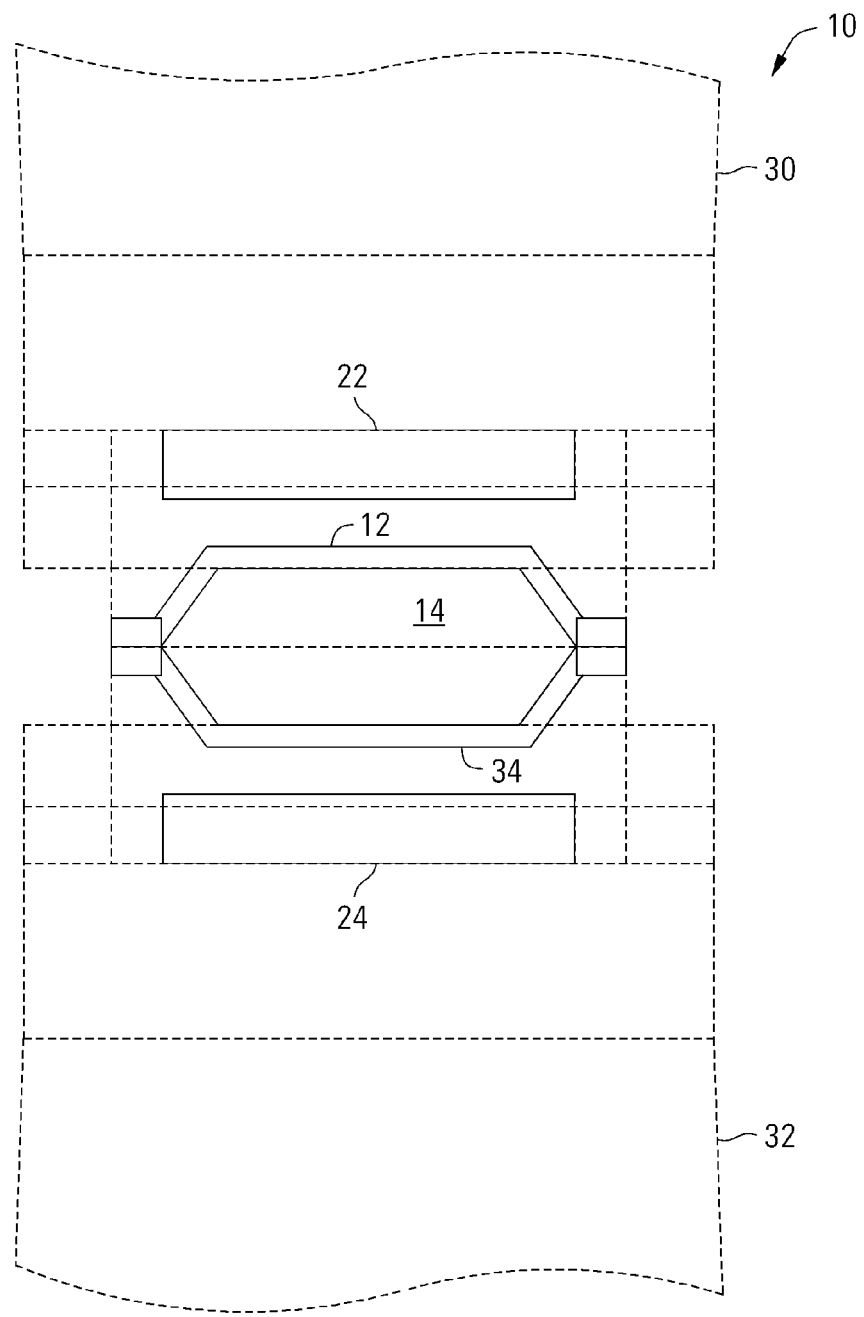
FIG. 3 depicts an end view of a TWT with a quasi-sheet beam SWS.

The drawings and description, in general, disclose various embodiments of a vacuum electronic device including a quasi-sheet beam device and a spatial power combining array TWT, also referred to herein as an array TWT. The array TWT may be based on a variety of different slow wave structures that are adapted to be combined edge to edge in a slow wave structure array or SWS array. As slow wave structures are combined in an array, the power capacity and thermal capabilities are greatly improved. In one embodiment, an array TWT may be formed using an array of quasi-sheet beam slow wave structures and may be used in any desired application such as a power booster for tactical communications and high resolution radar. The array TWT is not only highly suitable for microfabrication but is also highly stable without the complexity of over mode issues as in a typical sheet beam device.

A quasi-sheet beam TWT 10 is illustrated in FIGS. 1-4, in which a slow wave structure 12 is compressed in one direction (vertically as seen in FIGS. 1-4) to accommodate a flattened electron beam through the electron beam tunnel 14 of the SWS 12. Many of the drawings herein show a portion or all of the cavity within a traveling wave tube rather than the housing around the cavity, focusing instead on the cavity and the SWS within the cavity, through and around which an electron beam and RF signal travel. Generally, dashed lines are used herein to indicate a cavity which is contained within a housing, and the housing will be described in more detail later.

By flattening the electron beam, the interaction between the electron beam and the RF signal can be increased. Ridges 22 and 24 are placed adjacent the SWS 12 and provide capacitance to the RF signal. The RF signal enters the TWT 10 through input waveguides 26 and 28, travels in a vacuum through the TWT 10 and exits through the output waveguides 30 and 32, although coaxial or other types of connectors may also be used. In this embodiment, the SWS 12 is based on a tunnel ladder, with rungs (e.g., 34) running perpendicular to the tunnel 14 and the ridges 22 and 24.

Figure 4:
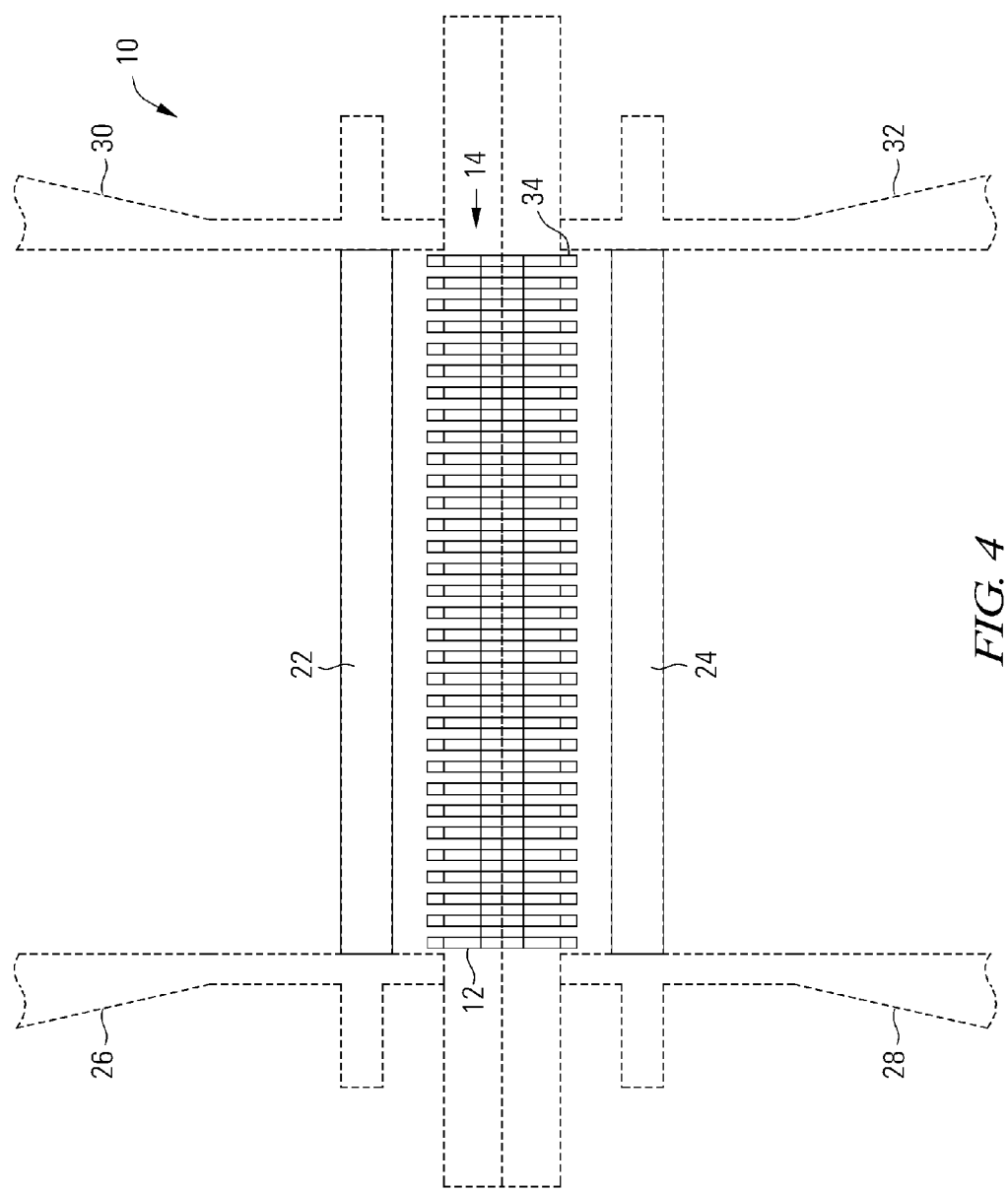
FIG. 4 depicts a side view of a TWT with a quasi-sheet beam SWS.

It should be noted that the RF tuners may be configured in any suitable size and shape, as in FIG. 4 vs. FIG. 1.

Details of the SWS 12 are illustrated in FIGS. 5 and 6, in which one rung 34 in the lower half of the SWS 12 is shown. The electron beam is steered through the tunnel 14 by magnetic fields created both by RF currents and by magnets placed around the TWT 10 (see, e.g., magnets 280 and 282 of FIG. 25, to be discussed below). As the RF signal passes through the TWT 10, RF currents are induced in the rungs (e.g., 34), traveling out the arms 36 and 38 in directions 40 and 42 as indicated by arrows 40 and 42. The rungs (e.g., 34) are shorted to a housing around the TWT (see, e.g., housing 240 of FIG. 25), at sides 44 and 46, then down the housing in directions 48 and 50. RF current flowing down the sides in directions 48 and 50 creates a magnetic field that steers the electron beam down the tunnel 14, preventing it from hitting the arms 36 and 38 at the sides of the tunnel 14.

The SWS 12 may be modified to open up the tunnel 14 so that an array of slow wave structures (12) may be formed in a power combining array. The lower half of a cell 70 in a modified SWS is illustrated in FIG. 7. The cell 70 is modified by moving the short positions of the ladder rungs from the sides 44 and 46 as in FIG. 6 the bottom wall 52 and 54 as in FIG. 7. The RF current travels in directions 53 and 55 through the rung 60 out from the center of the cell 70, and down the short structures or support walls 74 and 76 in directions 57 and 59. This RF current generates a magnetic wall at the sides 64 and 66 of the cell 70 analogous to that in the SWS 12 illustrated in FIG. 6. This magnetic wall at the sides 64 and 66 of the cell 70 steers the electron beam along the cell, preventing it from diverging at the sides 64 and 66. In conventional sheet beam TWTs, RF theory limits the width of the TWT due to the metal side walls (e.g., 36 and 38). In contrast, the width of a vacuum electronic power combining array with an array of magnetic side wall slow wave structures is not limited by RF theory, but by practical considerations only. Thus, as the number of SWS cells included in an array increases, the accuracy of the magnetic walls increases, the overall power of the device continues to increase and the relative effects of the TWT edges is reduced.

A ridge 56 lies under the rung 60, running perpendicular to the rung 60. Dielectric rods or spacers 58 such as diamond dielectrics may be placed between the rung 60 and ridge 56 if desired for stability and enhanced thermal conductivity. As illustrated in FIGS. 8A and 8B, the dielectric spacers 58 may have any of a number of suitable configurations. For example, as in FIG. 8B, a larger dielectric spacer 58 may fit into a channel or ditch in the ridge 56 to further increase thermal conductivity and physical strength. Modified tunnel ladder cells 70 thus have a beam cavity 62 that is opened at the sides 64 and 66 to form a planar cavity 68 (FIG. 9) or electron beam tunnel when multiple cells 70 are placed side by side in a linear array. The electron beam tunnels of each cell 70 are contiguous in the array to form a larger shared electron beam tunnel 68. The planar cavity 68 is suitable for a sheet electron beam, or for an array of individual electron beams in any suitable configuration, such as oval or elliptical electron beams or round pencil beams. If an array of individual electron beams are used, they may be allocated with one electron beam per cell 70 or in other arrangements.

A quasi-sheet beam SWS has the ability to be connected to other quasi-sheet beam SWS's because instead of a metal wall (e.g., the arms 36 and 38 of FIG. 6) it has a magnetic wall (e.g., at the sides 64 and 66 of FIG. 8). The number of cells in the array may be extended as far as desired and as is practical, with the relative effects of edges in the TWT being reduced as the number of cells in the array is increased. Again, the electron beam may comprise a single sheet beam, multiple flattened oval or elliptical beams, multiple beamlets forming a sine shape, etc. Directing much of the electron beam down the center of a cell reduces loss by directing little of it down the sides near the magnetic wall where the beam does not propagate. Balanced against this is the desire to maximize the interaction between the electron beam and the RF signal in the SWS.

Figure 9:
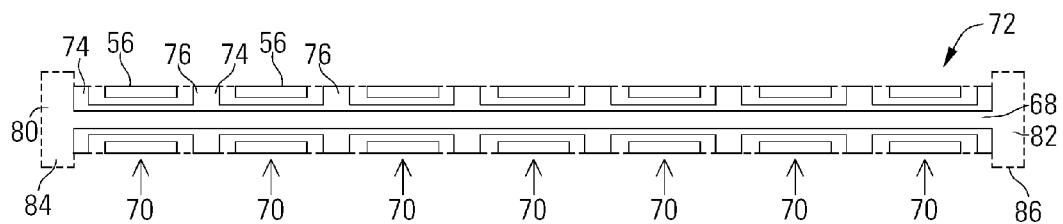
FIG. 9 depicts a cross section of a SWS array.
Figure 10:
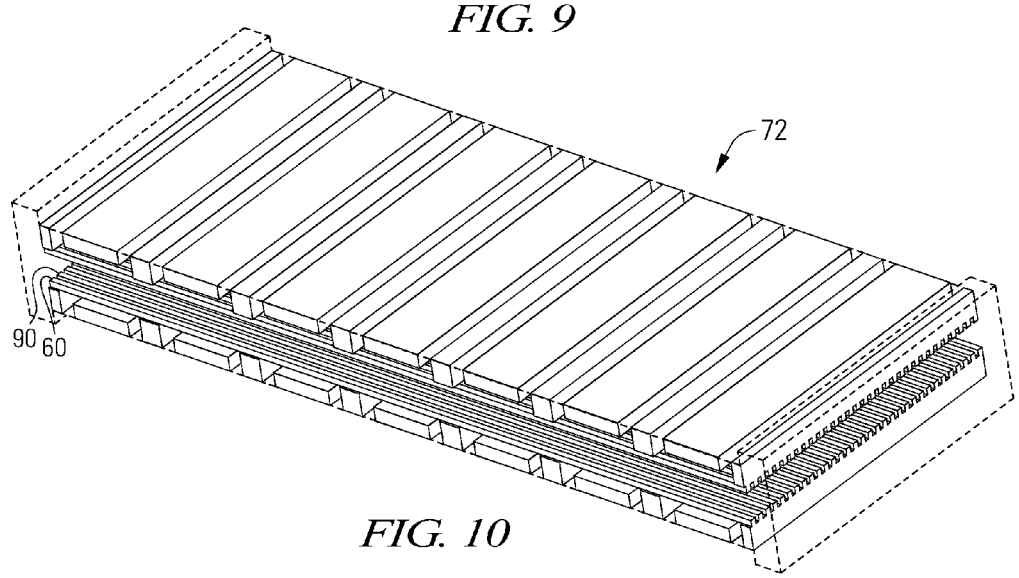
FIG. 10 depicts a perspective view of a SWS array.

A lower half (see FIG. 7) and an upper half of a cell 70 are combined to form a complete cell 70, and multiple cells 70 are combined side by side to form a SWS array 72 having multiple modified tunnel ladder channels, as illustrated in FIGS. 9 and 10. In the embodiment based on a modified tunnel ladder SWS, the support walls 74 and 76 of adjacent cells 70 are merged into a single support wall, such that the overall SWS array 72 forms an integral unitary device. FIG. 9 shows the cross section and FIG. 10 shows the 3-dimensional view of the SWS array 72 consisting of a linear array of multiple modified tunnel ladder channels. As illustrated in FIG. 9, the support walls of each cell are joined in the SWS array 72, so that the support walls between adjacent cells become twice as wide as those at the edges of the SWS array 72. This arrangement improves the symmetry of the electromagnetic fields across the SWS array 72, although the SWS array 72 is not limited to this arrangement. Note that the dielectric spacers 58 between the ladder rungs (e.g., 60) and the ridges 56 are not shown in FIGS. 4 and 5, however, if diamond or other high thermal conductivity dielectric materials are placed between the ladder rungs (e.g., 60) and the ridges 56, both bandwidth and thermal conductivity of the design can be improved.

Edge cavities 80 and 82 may be formed at the ends 84 and 86 of the SWS array 72 to minimize edge effects in the electromagnetic waves around the SWS array 72 during operation. Side edge effects can be reduced or canceled by adjusting the dimensions of the side cavities 84 and 86. The space or cavity within the dashed lines of FIGS. 3-8 is enclosed in a housing in a traveling wave tube and is placed under vacuum during operation (although the dashed lines do not necessarily denote the boundary location between internal space and housing walls). The number of cells 70 included from end 84 to end 86 in the SWS array 72 may be adapted as desired and can be as large as desired, with the power and thermal handling capacity increasing as the number of cells 70 increases. The total power of the sheet beam SWS approaches the sum of the individual quasi-sheet-beam SWS channels in the sheet beam. Furthermore, as the number of cells 70 in the SWS array 72 increases, edge effects have less relative impact on performance.

During operation, an electron beam and RF signal pass through the SWS array 72 perpendicular to the rungs (e.g. 60), i.e., into or out of the sheet in FIG. 9. The length of the SWS array 72 may be adapted as desired by varying the number of rungs (e.g., 60 and 90) and or the width and pitch of the rungs, based on factors such as the operating frequency and desired gain.

Figure 11:
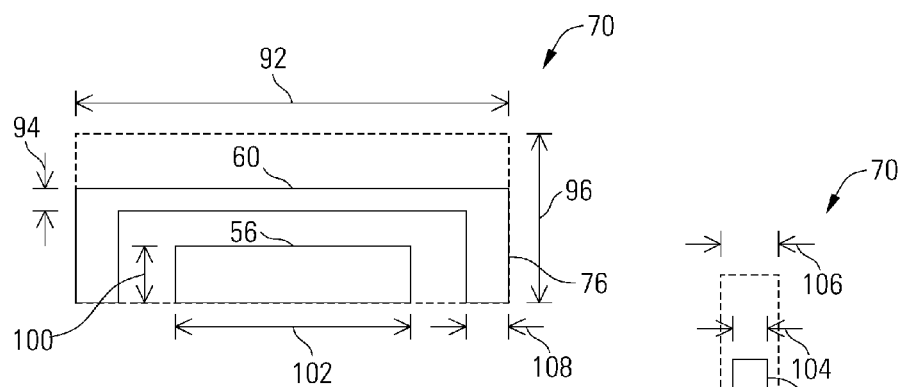
FIG. 11 depicts an end view of a unit cell of a half of a single tunnel ladder SWS.
Figure 12:
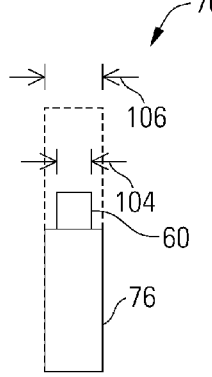
FIG. 12 depicts a side view of a unit cell of a half of a single tunnel ladder SWS.
Figure 13:
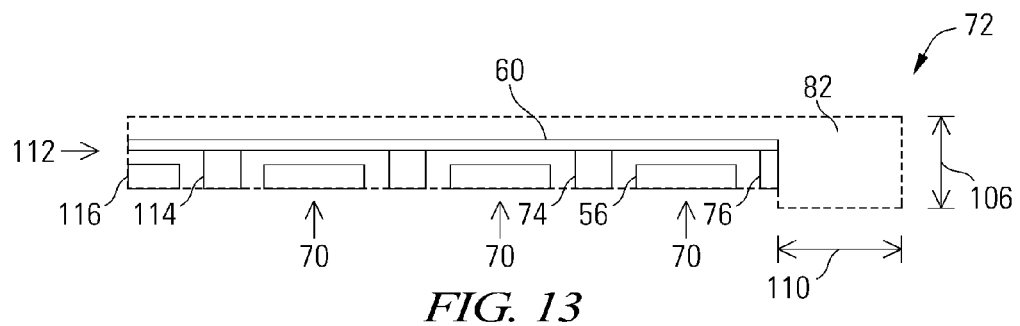
FIG. 13 depicts an end view of a portion of a SWS array with an edge cavity.

Cell dimensions for one example embodiment in a modified tunnel ladder SWS array are illustrated in FIGS. 11 and 12, although it is important to note that these are merely examples and the vacuum electronic spatial power combining array is not limited to these example dimensions or even to an array based on modified tunnel ladder cells. In this example, each cell has a side to side cell width 92 of about 1.84 mm, a rung height 94 of about 0.1 mm, a cell height 96 of about 0.72 mm, a ridge height 100 of about 0.24 mm and a ridge width 102 of about 1 mm. The rungs (e.g., 60) have a depth 104 of about 0.096 mm, while the support walls have a depth 106 of about 0.16 mm for each rung 60 and a width 108 of about 0.18 mm. As illustrated in FIG. 13, the edge cavity 82 may have a height 106 of about 0.92 mm for a half-cell, and a width 110 of about 1.23 mm. Again, the dimensions of the edge cavities 80 and 82 can be adjusted to minimize or eliminate electromagnetic edge effects in the SWS array 72. Cells 70 can have uniform dimensions across the array 72 so that electromagnetic characteristics are matched, or cells 70 may have different dimensions across the array 72 as desired.

Figure 14:
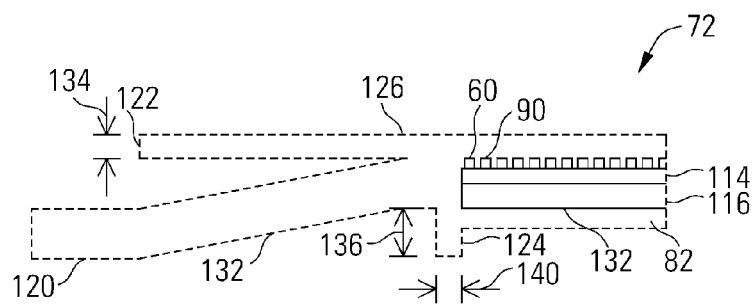
FIG. 14 depicts a side view of a portion of a vacuum electronic spatial power combining array TWT.
Figure 15:
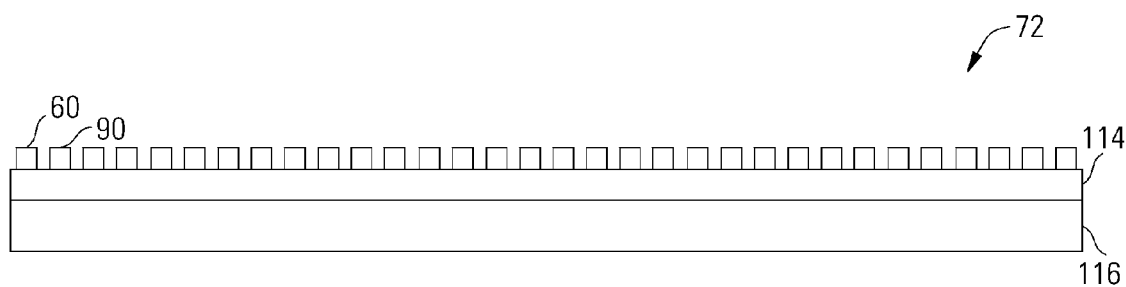
FIG. 15 depicts a side view of a lower half of a SWS array.

A partial end view of the SWS array 72 is illustrated in FIG. 14, looking into the left side cross-section 112 of FIG. 13, so that the ends of the rungs (e.g., 60) are exposed, and the sides of a support wall 114 and ridge 116. In this example embodiment, no dielectric supports are included, although they may be included if desired between the rungs (e.g., 60) and ridges (e.g., 56 and 116) as illustrated in FIG. 8. Note that a portion of support wall 114 is obscured by the ridge 116. The dashed outline 120 around the outside of FIG. 14 illustrates the interior cavity of part of a lower half of the SWS array 72, while solid lines are used to illustrate the structure of the SWS array 72. Portions of the cavity denoted by the dashed lines 120 are defined by the inside of a metal housing, other than at an electron beam port 122 and RF signal port 124, and at the boundary 126 between the two halves of the SWS array 72. For example, the ridges (e.g., 56 and 116) and support walls (e.g., 74, 76 and 114) are mounted to an inner surface of a housing at edge 130, although because the housing is not shown in FIG. 14, a portion of edge cavity 82 appears below edge 130. The shape and configuration of the cavity inside a TWT may be adapted to contain the SWS array and to meet the electromagnetic field requirements and to meet other requirements, such as electrical and thermal conductivity between the SWS array 72 and the housing to transfer heat away from the SWS array 72 during operation, ease of manufacturing, physical strength, etc. For example, the cavity may include RF match tuner spaces 132 at one or both port ends of the SWS array 72 to minimize loss in the RF signal as it enters and exits the SWS array 72. In embodiments in which other types of slow wave structures are combined in an array, the shape of the cavity may be adapted as needed and desired. In the embodiment of FIG. 14, the electron beam tunnel has a height 134 of about 0.23 mm in the lower half, or about 0.46 mm for the full height of the electron beam tunnel between opposing rungs. The RF port has a height 136 of about 0.47 mm and a width 140 of about 0.26 mm. Only a left port end of the lower half of the SWS array 72 is shown in FIG. 14, with an end view of the full extent of the SWS array 72 in one example embodiment shown in FIG. 15. Again, the number of rungs (e.g., 60 and 90), the width of the rungs and the pitch or spacing between the rungs may be adapted as desired based on the desired length of the SWS array 72. Ridges may be coextensive with the field of rungs or may be longer to overlap the field of rungs as in FIGS. 14 and 15, or shorter, as desired. Similarly, the rungs may be flush with the outer supporting walls as in FIG. 13, or may be longer or shorter, as desired.

Figure 16:
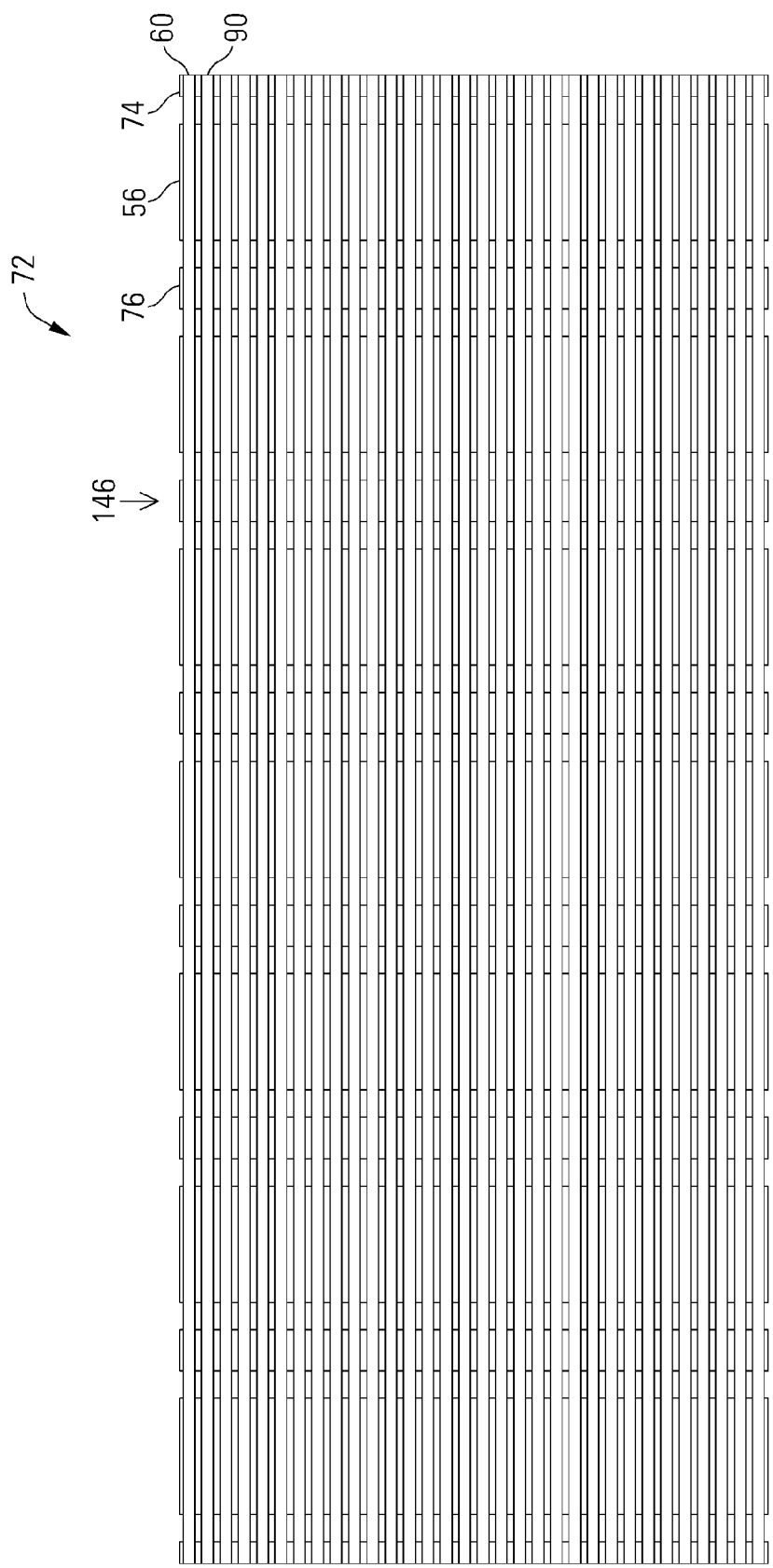
FIG. 16 depicts a bottom or inner view of a SWS array with ladder rungs in the foreground and with ridges and short structures in the background.
Figure 17:
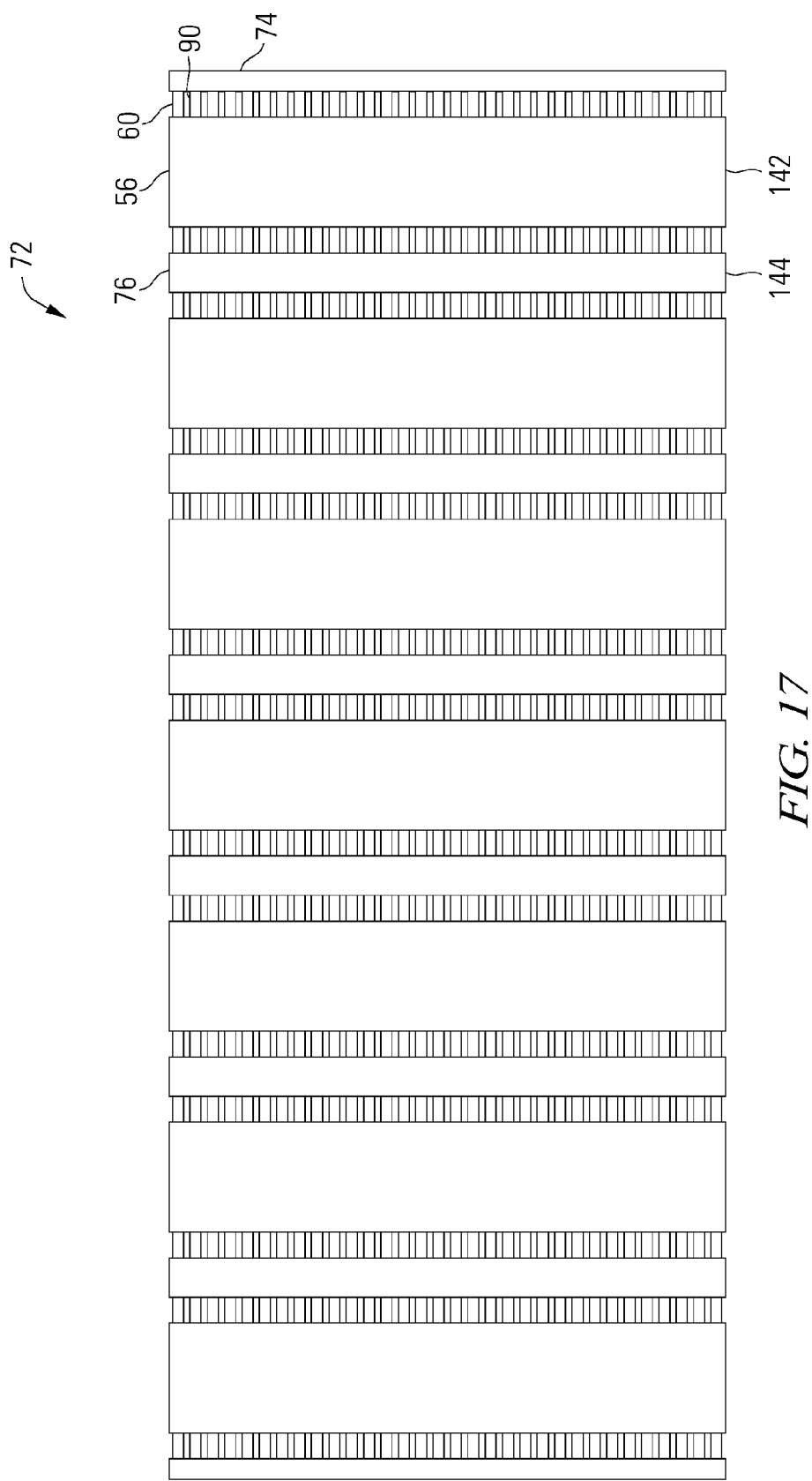
FIG. 17 depicts a top or outer view of a SWS array with ridges and short structures in the foreground and with ladder rungs in the background.

A bottom or inner view of the SWS array 72 is illustrated in FIG. 16, seen from inside the electron beam tunnel, with ladder rungs (e.g., 60 and 90) in the foreground and with ridges (e.g., 56) and support walls or short structures (e.g., 74 and 76) in the background. A top or outer view of the SWS array 72 is illustrated in FIG. 17, seen from the outside with ridges (e.g., 56) and support walls or short structures (e.g., 74 and 76) in the foreground and with ladder rungs (e.g., 60 and 90) in the background. The outer surfaces (e.g., 142, 144) of the ridges (e.g., 56) and support walls (e.g., 74 and 76) seen in FIG. 17 are mounted to an inner surface of a housing in any suitable manner, such as by brazing or bonding, or by forming them as an integral unit.

The SWS array 72, including the rungs (e.g., 60 and 90), ridges (e.g., 56) and support walls (e.g., 74 and 76) may be formed of any material suitable for conducting electricity that provides good physical strength and thermal conductivity and manufacturability, such as copper alloys.

During operation, the electron beam and RF signal travel in a direction 146 perpendicular to the rungs (e.g., 60 and 90). The electron beam and RF signal may travel in the same direction for a forward wave oscillator or in opposite directions for a backward wave oscillator as desired.

Figure 18:
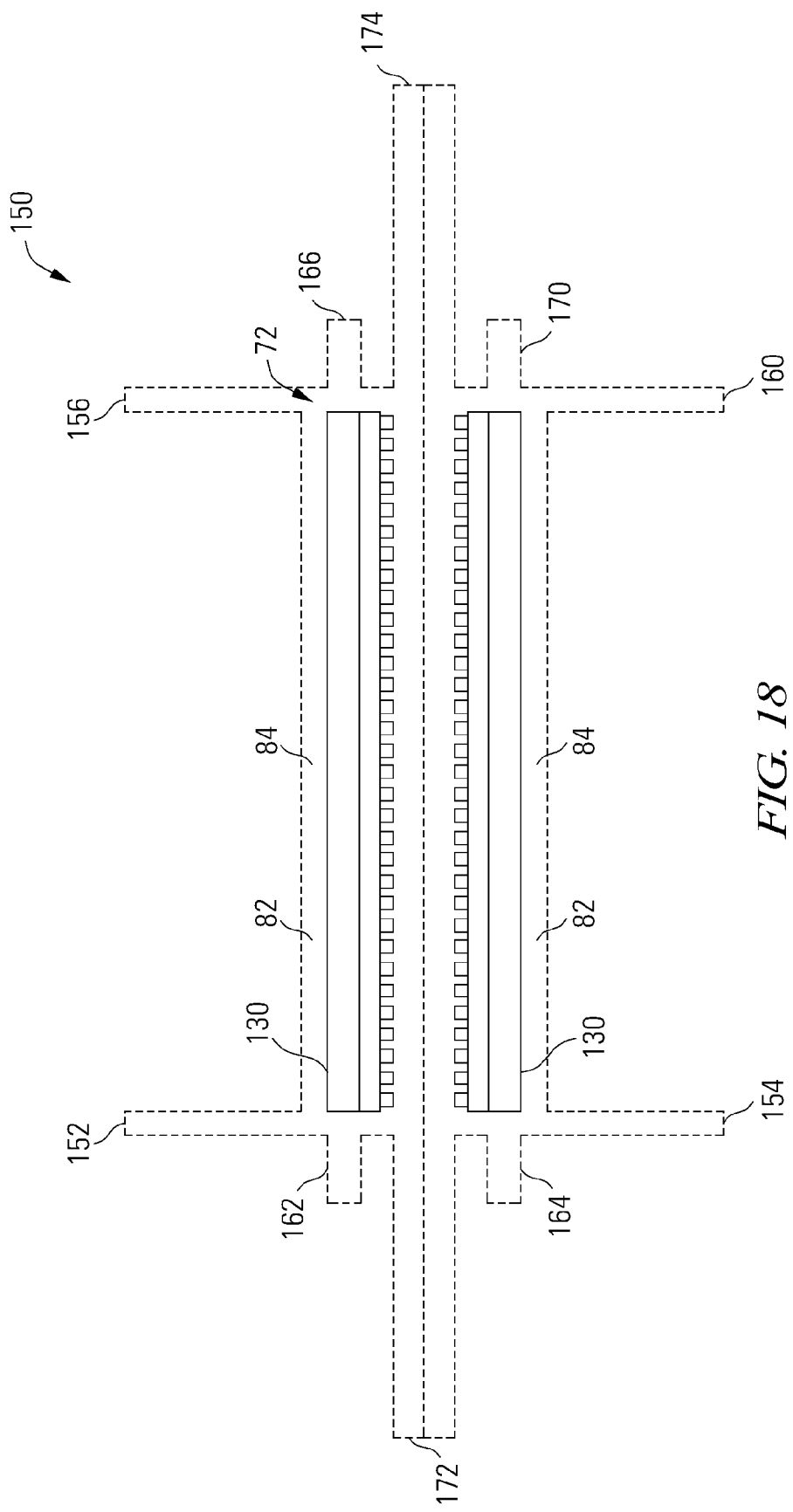
FIG. 18 depicts a side view of a vacuum electronic spatial power combining array TWT adapted for perpendicular RF port feeding.

Turning now to FIG. 18, a side view of an array TWT 150 containing a modified tunnel ladder SWS array 72 is illustrated. In this embodiment, the array TWT 150 is adapted for perpendicular RF port feeding, with the RF signal entering the array TWT 150 at one or both input ports 152 and 154 and exiting at one or both output ports 156 and 160. RF match tuners 162, 164, 166 and 170 may be provided, shaped and sized as desired to minimize loss. An electron beam may enter and exit at beam ports 172 and 174. Again, the electron beam may travel in the same direction as the RF signal through the array TWT 150 in a forward wave oscillator or in opposite directions in a backward wave oscillator.

As described above, the dashed lines represent the edges of the internal cavity of the array TWT 150, and solid lines represent the structure of the SWS array 72. The housing surrounds the cavity of the array TWT 150, enclosing it such that the cavity may be placed under vacuum during operation. The housing includes RF transparent windows and/or openings at some or all of the input and ports 152, 154, 156 and 160 and electron beam ports 172 and 174. The outer edges 130 of the SWS array 72 are connected to the inner surface of the housing, although the dashed lines extend beyond the outer edges 130 of the SWS array 72 in FIG. 18, showing the edge cavities 82 and 84 that at the edges of the SWS array 72. Again, edge cavities 82 and 84 may be provided to minimize or eliminate edge effects in the electromagnetic field at the edges of the SWS array 72, and may be shaped and sized as desired or needed.

Figure 19:
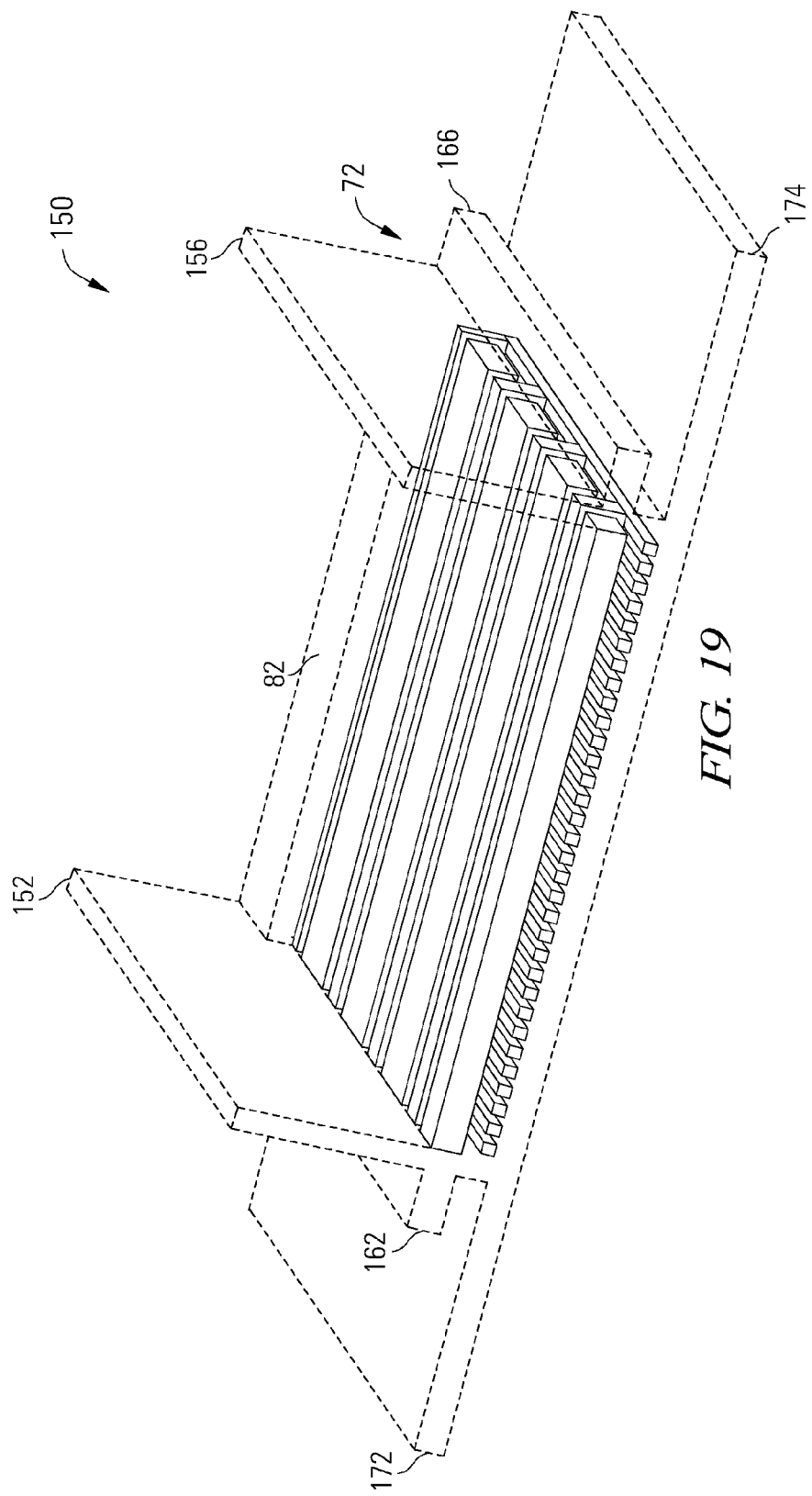
FIGS. 19 and 20 depict the same perspective view of half of the vacuum electronic spatial power combining array TWT of FIG. 18, with FIG. 19 having only foreground dashed lines visible and with FIG. 20 having all dashed lines visible to clearly illustrate the extent of the cavity space in the TWT.
Figure 20:
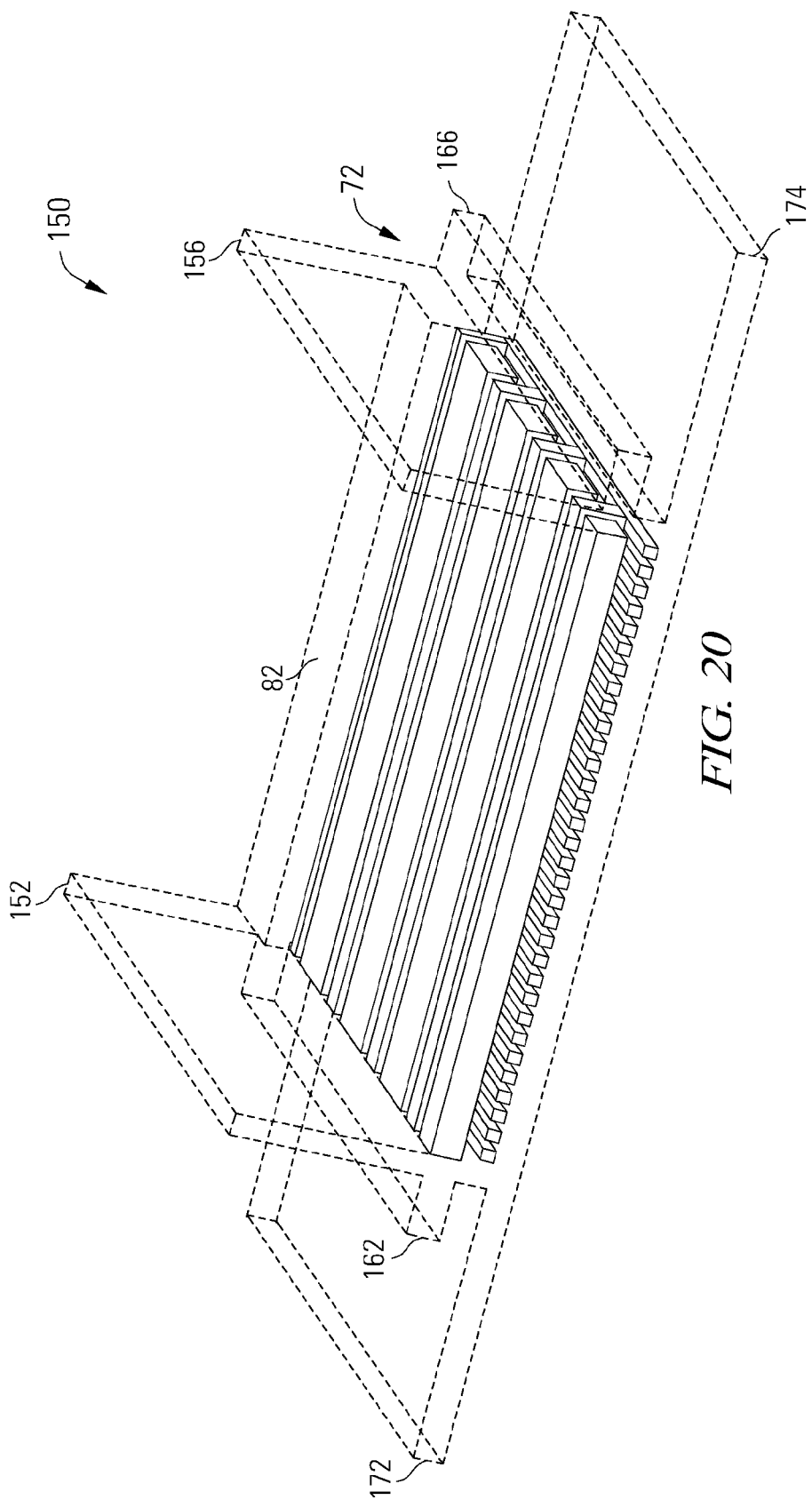

A far side of the upper half of the array TWT 150 is illustrated in perspective view in FIGS. 19 and 20, including the edge cavity 82 at the far side. The views of FIGS. 19 and 20 show a cross-section of the cavity and SWS array 72 taken from port 172 to port 174, taken at the halfway point of a ridge 176. No dielectrics are shown between the ridges and rungs for clarity, although they may be included as shown in FIG. 8. In FIG. 19, solid structures of the SWS array 72 (drawn with solid lines) may be seen through the dashed lines illustrating the cavity in which the SWS array 72 lies. However, for clarity, dashed lines are clipped so that only the foreground dashed lines are visible. FIG. 20 shows the same figure without this foreground clipping of dashed lines, illustrating the entire three dimensional cavity space of this portion of the array TWT 150.

Figure 21:
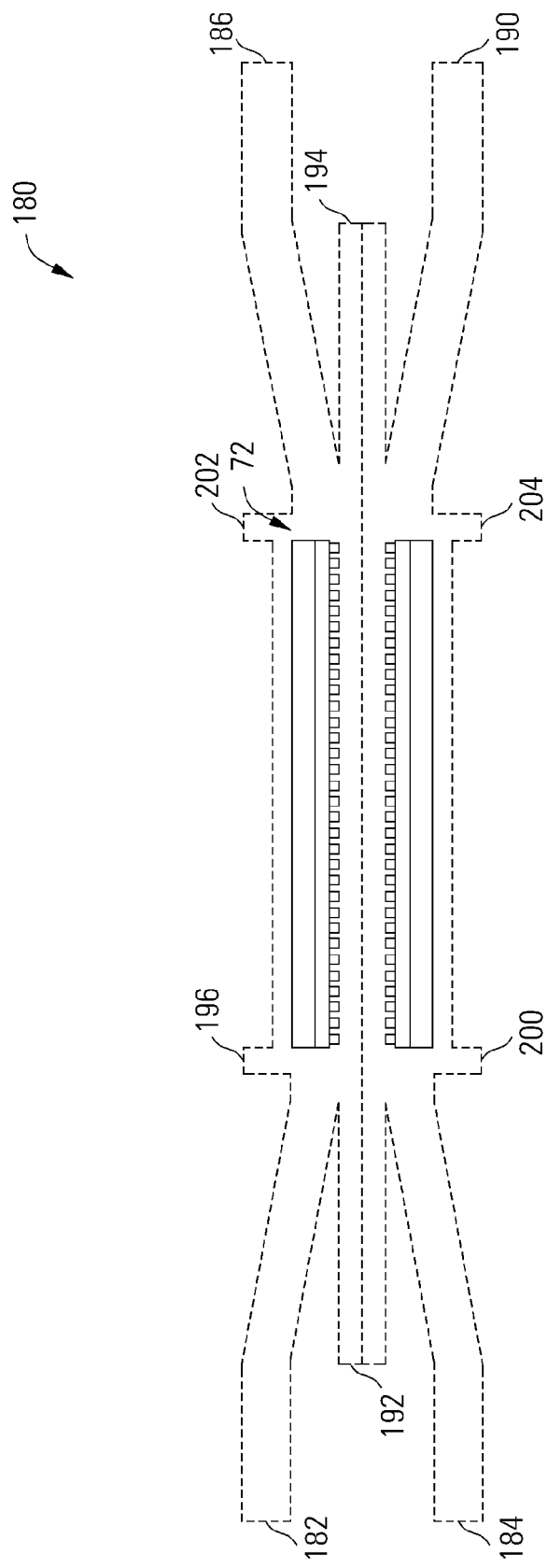
FIG. 21 depicts a side view of a vacuum electronic spatial power combining array TWT adapted for end RF port feeding.
Figure 22:
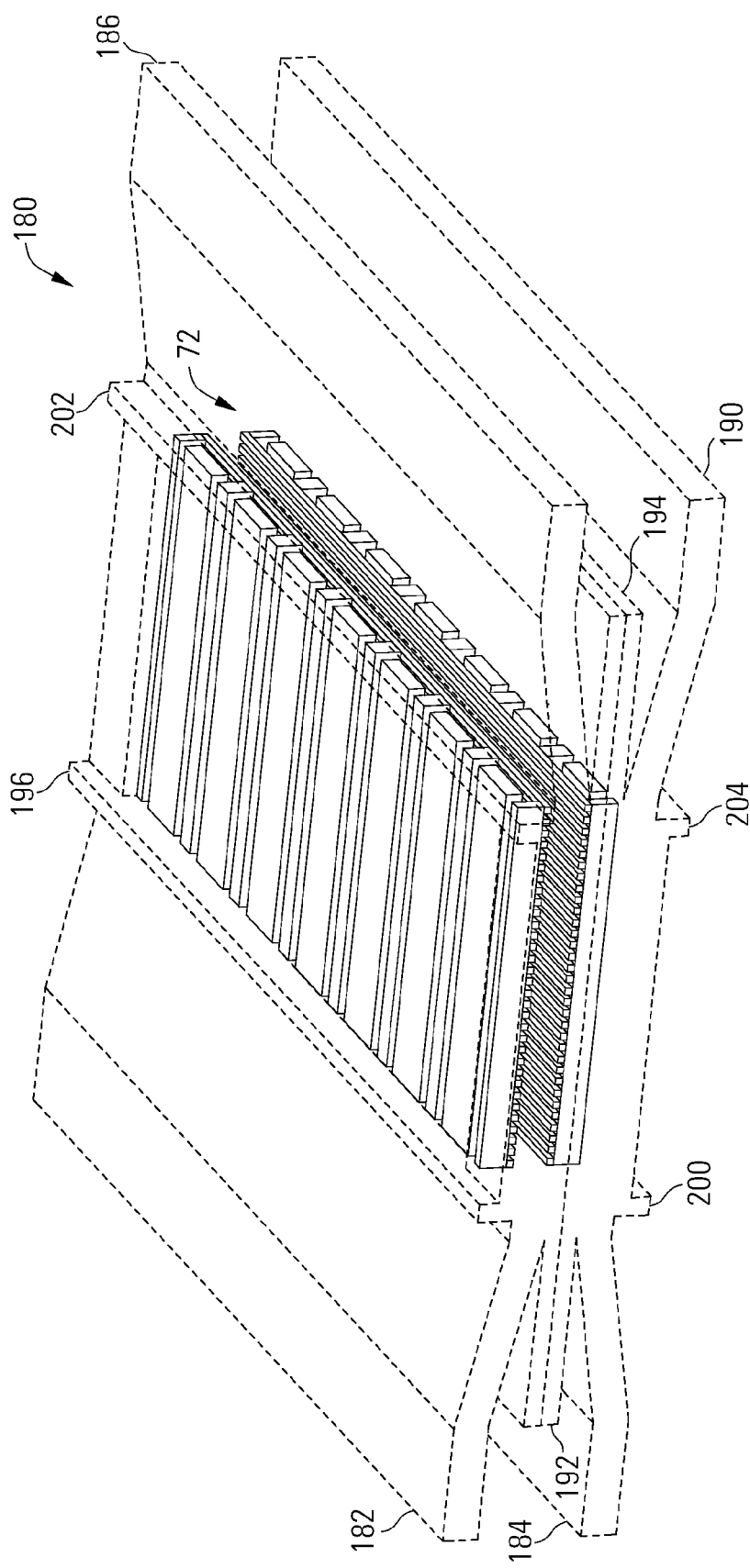
FIG. 22 depicts a perspective view of the vacuum electronic spatial power combining array TWT of FIG. 15.

Turning now to FIG. 21, another embodiment of an array TWT 180 may be adapted for end RF port feeding. In this embodiment, the RF signal enters the array TWT 180 at one or both input ports 182 and 184 and exiting at one or both output ports 186 and 190. An electron beam may enter and exit at beam ports 192 and 194. RF match tuners 196, 200, 202 and 204 may be provided, shaped and sized as desired to minimize loss. Again, the electron beam may travel in the same direction as the RF signal through the array TWT 180 in a forward wave oscillator or in opposite directions in a backward wave oscillator. Other embodiments of an array TWT may have RF ports and match tuners in other configurations and shapes, and are not limited to the particular example embodiments disclosed herein. A perspective view of the array TWT 180 is illustrated in FIG. 22, showing the internal cavity and SWS array 72, including edge cavities at both edges, that is enclosed in a housing. In this embodiment, the dashed lines illustrate the internal cavity of the array TWT 180 and the contours of the inner housing surfaces.

Figure 23:
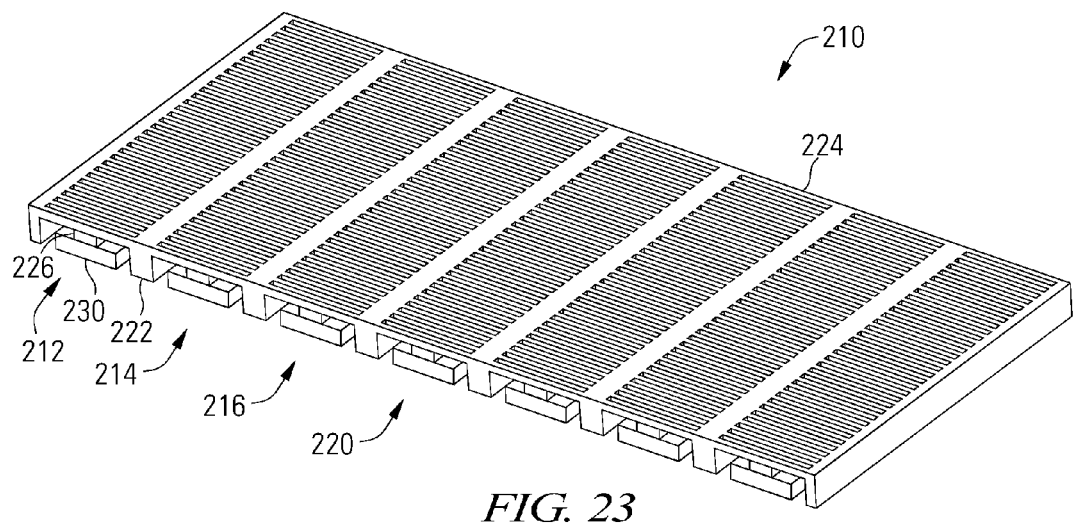
FIG. 23 depicts a perspective view of half of a SWS array with solid support wall connections and with dielectric spacers.

The lower half of another embodiment of a SWS array 210 is illustrated in FIG. 23. In this embodiment, four modified tunnel ladder cells 212, 214, 216 and 220 are combined in a linear array, joined at support walls (e.g., 222) or short structures. In this embodiment, the rungs (e.g., 224) are separated only over the cell cavity, and are joined over the support walls (e.g., 222). This arrangement improves thermal performance, increasing the ability to transfer heat out of the SWS array 210 to the housing and away from the array TWT during operation. Dielectric spacers (e.g., 226) are also included between ridges (e.g., 230) and rungs (e.g., 224) to further improve thermal performance and mechanical rigidity.

Figure 24:
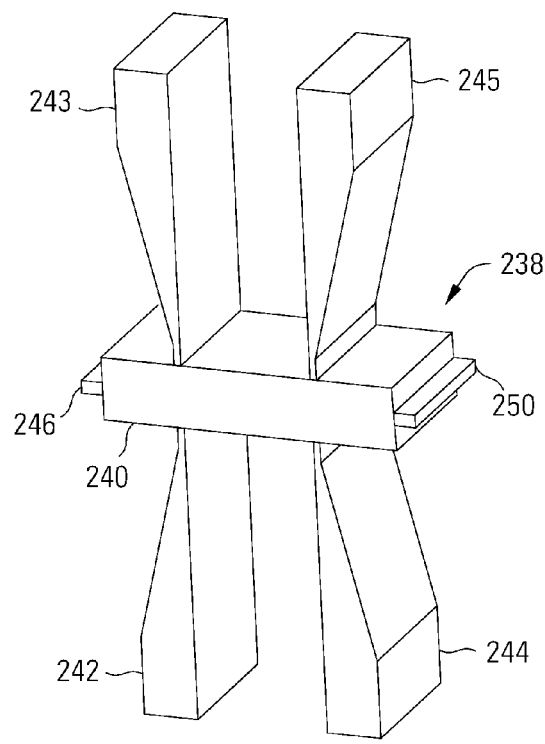
FIG. 24 depicts a perspective view of an array TWT housing with RF waveguides.

An array TWT 238 with a housing 240 that may be used to enclose any of the various SWS arrays disclosed herein or variations thereof is illustrated in FIG. 24. Although the housing 240 may have any suitable shape as desired, a rectangular housing 240 facilitates mounting of external electron beam steering magnets. The housing 240 illustrated in FIG. 24 is adapted for use with perpendicular RF ports, connected to RF waveguides 242 and 244. The housing 240 may also be adapted for use with other types of couplers, such as coaxial RF couplers. If RF waveguides are used, windows may be provided in the housing 240 or waveguides 242 and 244, consisting of a material which can maintain a vacuum within the housing 240 while being substantially transparent to the RF signal in the target frequency ranges to allow the RF signal to pass into and out of the array TWT 238. Elongated electron beam ports 246 and 250 are provided at the ends of the array TWT housing 240, allowing a sheet electron beam, a linear array of electron beams, or any other suitable electron beam to enter and exit the array TWT 238. The housing 240 may be fabricated in any suitable manner of materials that provide good thermal and electrical conductivity and mechanical strength, such as copper alloys. The array TWT 238 may be microfabricated using techniques such as LIGA (lithography, electroplating, and molding), X-Ray related techniques. The array TWT 238 may also be microfabricated using DRIE (deep ion reactive etching) and other MEMS techniques including metal MEMS and a combination of advanced subtractive (i.e., etching) and additive (i.e., growth and deposition) techniques coupled with photolithography achieve highly accurate and precise microfabricated millimeter-wave interaction circuits. These techniques and related processes allow RF slow wave interaction structures to be fabricated for use in the millimeter-wave and higher frequency ranges.

The array TWT housing 240 of FIG. 24 includes four RF ports, two input ports 242 and 243 and two output ports 244 and 245. The signals for the input ports 242 and 243 may be provided from a single feed using a splitter or magic tee, and the signals from the output ports 244 and 245 may be combined in a tee if desired.

Turning now to FIG. 22, a block diagram of a system including the array TWT 238 is illustrated. An electron gun 260 is connected to an electron beam port 262 on the array TWT 238, and a collector 264 is connected to another electron beam port 266. Again, the array TWT 238 is not limited to use with any particular type or number of electron guns and/or collectors. For example, an array of pencil beam or oval beam electron guns may be used, one per cell in the SWS array, with a single plate collector. A sheet beam electron gun may also be used, or any other suitable electron beam source now known or that may be developed in the future. In one embodiment, a sheet beam electron gun may be based on a cathode with a relatively high current density of 50 A/cm2, for example by pulsing a conventional cathode. With a compression ratio of 15, the current density in the beam tunnel can be 750 A/cm2 with a potential output power (cw) of over 50 Watts at 220 GHz. An electronic efficiency of close to 11% is obtained with these design parameters. This eliminates the necessity of a multiple-stage depressed collector (MSDC). However, a MSDC can alternatively be employed to increase the overall efficiency of a 220 GHz high power amplifier TWT.

An ion pump 270 or other vacuum generating device may be connected to the array TWT 238, either directly or through the electron gun 260 or collector 264, through a vacuum capable coupling 272. RF ports 274, 275, 276 and 277 are provided through the housing 240 of the array TWT 238 to couple an RF signal and decouple an amplified RF signal. Magnets 280 and 282 are provided around the housing 240 of the array TWT 238 to steer the electron beam through the array SWS. The magnets may comprise solenoids, permanent periodic magnets, or any other suitable type of magnet to direct the electron beam. The magnets may comprise integral plates for each side of the array TWT 238, or arrays of bar magnets, etc. A notched wiggler magnet array can provide vertical and horizontal confinement of high perveance sheet electron beams with small transverse dimensions. A wiggler consists of upper and lower stacks of permanent magnets with opposing magnetization direction. The process of non-linear focusing by a shaped wiggler is robust and tolerant. The notched array has the additional virtues that it is easy to fabricate, makes effective use of the magnetic material and is insensitive to the size of the magnet step and details of the beam distribution.

Figure 25:
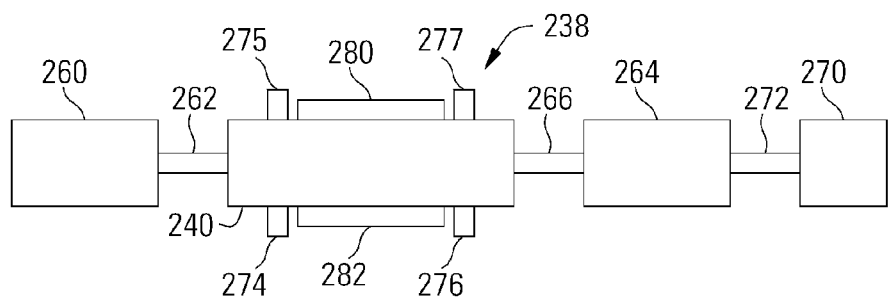
FIG. 25 depicts a block diagram of an array TWT with electron gun, collector, ion pump and beam steering magnets.
Figure 26:
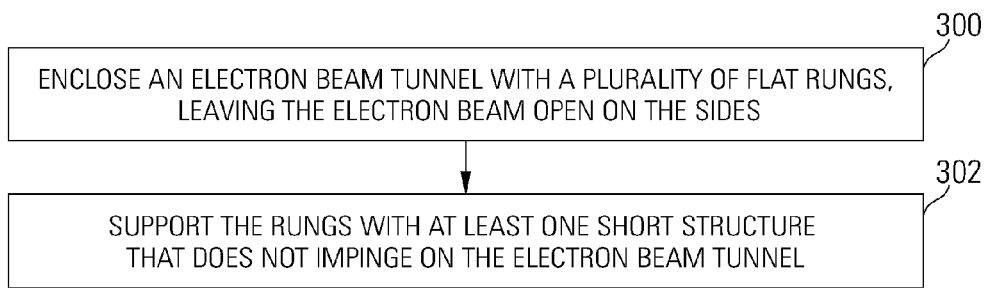
FIG. 26 depicts an example of an operation for manufacturing a vacuum electronic spatial power combining array.

An example of an operation for manufacturing a vacuum electronic device is illustrated in the flowchart of FIG. 25. An electron beam tunnel is enclosed with a plurality of flat rungs, leaving the electron beam open on the sides. (Block 300) The rungs are supported with at least one short structure that does not impinge on the electron beam tunnel. (Block 302)

The resulting SWS cell may be connected in a power combining array, forming a SWS that may be microfabricated using a number of different techniques, such as by DRIE etching, additive techniques, photolithography etc. to build the SWS array layer by layer without the need to fabricate, align and assemble multiple different parts.

The vacuum electronic spatial power combining array or array TWT disclosed herein provides high power capabilities in a device that may be efficiently fabricated. The array TWT may be fabricated in two halves which are then combined, or in layers that may be fabricated relatively easily without alignment and assembly problems common in conventional TWTs. By combining an array of devices or slow wave structures, the power capabilities are also combined, allowing the use of one large magnetic envelope and magnet system. The array TWT may be based on an array of any suitable type of slow wave structure, such as a tunnel ladder, helix, planar structures such as meander lines, and high aspect ratio structures such as coupled cavities, etc. The array TWT prevents mode competition associated with nonsymmetrical, rectangular cavities due to confinement by periodic parallel slow wave structures, thereby preventing oscillation arising from beam energy exchange.

In one embodiment of a 220 GHz TWT, the minimum structural dimension is 41 μm which may be manufactured using microfabrication. A relatively high interaction impedance of close to 30 Ohms may be achieved, with a good beam/RF match of close to 20 dB. A 2.3% bandwidth may be realized by optimizing the modified ladder SWS including the size of the ridge and the gap between the ladder and the ridge. In one embodiment, an electronic efficiency of close to 11% is achieved.

While illustrative embodiments have been described in detail herein, it is to be understood that the concepts disclosed herein may be otherwise variously embodied and employed, and that the appended claims are intended to be construed to include such variations, except as limited by the prior art.

What is claimed is:

1. A vacuum electronic device comprising:
    a vacuum housing; and
    an array of electrically conductive slow wave structures inside the vacuum housing, each partially enclosing one of a plurality of electron beam tunnels, wherein the array of slow wave structures are joined such that the plurality of electron beam tunnels combine to form a common electron beam tunnel, and wherein the slow wave structures are operable to carry induced electrical currents and create electromagnetic fields to transfer energy from an electron beam in the common electron beam tunnel to an RF signal passing along the slow wave structures.

2. The vacuum electronic device of claim 1, wherein the common electron beam tunnel comprises a planar beam cavity.

3. The vacuum electronic device of claim 1, wherein at least one of the array of electrically conductive slow wave structures comprises a tunnel ladder cell.

4. The vacuum electronic device of claim 3, wherein the tunnel ladder cell comprises a plurality of electrically conductive rungs running perpendicular to one of the plurality of electron beam tunnels corresponding to the tunnel ladder cell.

5. The vacuum electronic device of claim 4, wherein the plurality of electrically conductive rungs are electrically connected to the vacuum housing.

6. The vacuum electronic device of claim 4, wherein the plurality of electrically conductive rungs are arranged in spaced apart fashion on two sides of said one of the plurality of electron beam tunnels.

7. The vacuum electronic device of claim 4, wherein the tunnel ladder cell further comprises an electrically conductive ridge running perpendicular to the plurality of electrically conductive rungs on a side of the plurality of electrically conductive rungs opposite said one of the plurality of electron beam tunnels.

8. The vacuum electronic device of claim 7, wherein the tunnel ladder cell further comprises a dielectric rod between the electrically conductive ridge and the plurality of electrically conductive rungs.

9. The vacuum electronic device of claim 8, wherein the dielectric rod lies in a channel in the electrically conductive ridge.

10. The vacuum electronic device of claim 4, wherein the plurality of electrically conductive rungs in the tunnel ladder cell leave a pair of open sides in said one of the plurality of electron beam tunnels in the tunnel ladder cell, operable to couple to open sides in adjacent ones of the array of electrically conductive slow wave structures.

11. The vacuum electronic device of claim 4, wherein the tunnel ladder cell further comprises a pair of electrically conductive support walls between the plurality of electrically conductive rungs and an inner surface of the vacuum housing, wherein the plurality of electrically conductive rungs and the pair of electrically conductive support walls are operable to conduct an induced RF signal.

12. The vacuum electronic device of claim 11, wherein the plurality of electrically conductive rungs and the pair of electrically conductive support walls are operable to create magnetic walls at a pair of open sides in said one of the plurality of electron beam tunnels in the tunnel ladder cell when conducting the induced RF signal to steer an electron beam down said one of the plurality of electron beam tunnels.

13. A method of manufacturing a vacuum electronic device, comprising:
    providing a vacuum housing;
    providing an array of electrically conductive slow wave structures inside the vacuum housing, each partially enclosing one of a plurality of electron beam tunnels, wherein the array of slow wave structures are joined such that the plurality of electron beam tunnels combine to form a common electron beam tunnel, and wherein the slow wave structures are operable to carry induced electrical currents and create electromagnetic fields to transfer energy from an electron beam in the common electron beam tunnel to an RF signal passing along the array of slow wave structures.

14. The method of claim 13, wherein providing the array of electrically conductive slow wave structures comprises supporting a plurality of electrically conductive rungs within the vacuum housing on a first side and a second side of the common electron beam tunnel by a plurality of electrically conductive support walls, wherein each of the array of electrically conductive slow wave structures comprises a portion of the plurality of electrically conductive rungs along a corresponding one of the plurality of electron beam tunnels and at least a portion of at least one of the electrically conductive support walls.

15. The method of claim 14, further comprising brazing the plurality of electrically conductive support walls to inner surfaces of the vacuum housing.

16. The method of claim 14, wherein providing the array of electrically conductive slow wave structures further comprises mounting an electrically conductive ridge in each of the array of electrically conductive slow wave structures between the support walls and perpendicular to the plurality of electrically conductive rungs.

17. The method of claim 16, further comprising mounting a dielectric rod between each of the electrically conductive ridges and the plurality of electrically conductive rungs.

18. The method of claim 13, further comprising providing an electron beam input port, an electron beam output port, an RF input port and an RF output port in the vacuum housing.

19. The method of claim 13, further comprising mounting electron beam steering magnets outside the vacuum housing.

20. A vacuum electronic device, comprising:
    a vacuum housing;
    an array of electrically conductive slow wave structures inside the vacuum housing, each partially enclosing one of a plurality of electron beam tunnels, wherein the array of slow wave structures are joined such that the plurality of electron beam tunnels combine to form a common electron beam tunnel, and wherein the slow wave structures are operable to carry induced electrical currents and create electromagnetic fields to transfer energy from an electron beam in the common electron beam tunnel to an RF signal passing along the slow wave structures;
    an electron beam input port in the vacuum housing at a first end of the common electron beam tunnel;
    an electron beam output port in the vacuum housing at a second end of the common electron beam tunnel;

at least one RF input port in the vacuum housing operable to receive the RF signal into the vacuum housing;
at least one RF output port in the vacuum housing operable to output the RF signal from the vacuum housing.

* * * * *